(12) United States Patent
Ishida

(10) Patent No.: US 7,579,923 B2
(45) Date of Patent: Aug. 25, 2009

(54) LAMINATED BALUN TRANSFORMER

(75) Inventor: Kosuke Ishida, Ritto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/277,357

(22) Filed: Nov. 25, 2008

(65) Prior Publication Data

US 2009/0072923 A1    Mar. 19, 2009

Related U.S. Application Data

(63) Continuation of application No. PCT/JP2007/058523, filed on Apr. 19, 2007.

(30) Foreign Application Priority Data

Jun. 1, 2006    (JP) .............................. 2006-153210

(51) Int. Cl.
*H03H 7/42* (2006.01)
*H01P 3/08* (2006.01)

(52) U.S. Cl. ........................................ 333/26; 333/238

(58) Field of Classification Search ................... 333/25, 333/26, 185, 238, 246; 336/200
See application file for complete search history.

(56) References Cited

U.S. PATENT DOCUMENTS

| 5,497,137 | A | 3/1996 | Fujiki | |
|---|---|---|---|---|
| 6,448,879 | B1 * | 9/2002 | Kitamura | 336/200 |
| 6,713,162 | B2 * | 3/2004 | Takaya et al. | 428/209 |
| 7,283,028 | B2 * | 10/2007 | Yoshida et al. | 336/200 |
| 7,439,842 | B2 * | 10/2008 | Fujiki et al. | 336/200 |

FOREIGN PATENT DOCUMENTS

| JP | 04-206905 A | 7/1992 |
|---|---|---|
| JP | 06-120428 A | 4/1994 |
| JP | 08-191016 A | 7/1996 |
| JP | 11-214943 A | 8/1999 |
| JP | 2002-359507 A | 12/2002 |
| JP | 2005-333011 A | 12/2005 |
| JP | 2006-13063 A | 1/2006 |
| WO | 2006/057115 A1 | 6/2006 |
| WO | 2006/123485 A1 | 11/2006 |

OTHER PUBLICATIONS

Official Communication issued in International Patent Application No. PCT/JP2007/058523, mailed on Jul. 31, 2007.

* cited by examiner

*Primary Examiner*—Dean O Takaoka
(74) *Attorney, Agent, or Firm*—Keating & Bennett, LLP

(57) ABSTRACT

A laminated balun transformer that may be used for lines having various impedances includes a first magnetic substrate, a laminated body, a second magnetic substrate, and external electrodes. The laminated body includes a first transformer, a second transformer, and an insulator that covers the first and second transformers. The first transformer includes a primary coil and a secondary coil. The second transformer includes a primary coil and a secondary coil. The line width of the primary coil of the first transformer is set so as to decrease from the side of the internal electrode towards the side of the internal electrode. The line width of the secondary coil of the second transformer is also set so as to decrease from the side of the internal electrode towards the side of the internal electrode.

3 Claims, 10 Drawing Sheets

LAMINATED BALUN TRANSFORMER

BACKGROUND OF THE INVENTION

1. Field of the Invention

The present invention relates to a laminated balun transformer used as a balanced-unbalanced converter for an IC of a cellular phone, an antenna of a television receiver, or other suitable devices.

2. Description of the Related Art

The balun transformer includes a first transformer 100 and a second transformer 200 as shown in an equivalent circuit diagram of FIG. 22. Then, coils 101 and 102 that define the first transformer 100 and coils 201 and 202 that define the second transformer 200 are connected as shown in FIG. 22 to thereby set the ratio of an impedance on a side of an unbalanced terminal 300 to an impedance on a side of balanced terminals 301 and 302 to about 1 to 4. Japanese Unexamined Patent Application Publication No. 04-206905 and Japanese Unexamined Patent Application Publication No. 06-120428, for example, describe a technology for a laminated balun transformer that has a circuit structure as described above. These laminated balun transformers are configured such that coil conductive patterns defining coils of the first and second transformers 100 and 200 or magnetic sheets and non-magnetic sheets are laminated. Thus, the size of the balun transformer is reduced.

However, the above described laminated balun transformers of the related art have the following problems. In the balun transformer, when the impedance of the unbalanced terminal side is set to about 1, the impedance of the balanced terminal side is the square of the number of transformers. For example, when the number of transformers is 1, the ratio of an unbalanced terminal-side impedance to a balanced terminal-side impedance is about 1 to 1. As shown in FIG. 22, when the number of transformers is 2, the ratio of an unbalanced terminal-side impedance to a balanced terminal-side impedance is about 1 to 4 (i.e., the square of 2). Thus, when the ratio of an impedance of a balanced terminal side to an impedance of an unbalanced terminal needs to be changed, it is necessary to change the number of transformers. However, the ratio of an impedance of the balanced terminal side to the impedance of the unbalanced terminal has discrete values, such as 1, 4, 9, . . . , and, therefore, the difference between the adjacent ratios is relatively large. Thus, when the line of the balanced terminal side to the line of the unbalanced terminal side has a ratio of impedance, such as 2, 3, 6, . . . , the existing balun transformer cannot be used. That is, the existing balun transformer is not versatile and cannot be used for lines having various impedances.

SUMMARY OF THE INVENTION

To overcome the problems described above, preferred embodiments of the present invention provide a laminated balun transformer that may be used for lines having various impedances.

A preferred embodiment of the present invention provides a laminated balun transformer. The laminated balun transformer includes a first magnetic substrate, a laminated body including a first transformer and a second transformer, each of which includes a primary coil and a secondary coil that are laminated on the first magnetic substrate and that face each other, and a second magnetic substrate provided on the laminated body, wherein one end of the primary coil of the first transformer defines an unbalanced terminal and the other end of the primary coil defines a first balanced terminal, one end and the other end of the secondary coil define ground terminals, one end of the primary coil of the second transformer is connected to the one end of the primary coil of the first transformer and the other end of the primary coil of the first transformer is connected to the secondary coil of the first transformer, one end of the secondary coil of the second transformer is connected to the one end of the secondary coil of the first transformer and the other end of the secondary coil of the second transformer defines a second balanced terminal, and wherein the shape of the primary coil of the first transformer is set so that the line width of the primary coil of the first transformer increases or decreases from the one end towards the other end, and the shape of the secondary coil of the second transformer is set so that the line width of the secondary coil of the second transformer increases or decreases from the one end towards the other end. With this configuration, the shape of the primary coil of the first transformer is set so that the line width of the primary coil of the first transformer increases from the one end towards the other end, and the shape of the secondary coil of the second transformer is set so that the line width of the secondary coil of the second transformer increases from the one end towards the other end. Thus, the ratio of an impedance of the unbalanced terminal side to an impedance of the first and second balanced terminal sides may be less than about 1 to 4, such as about 1 to 3. In addition, the shape of the primary coil of the first transformer is set so that the line width of the primary coil of the first transformer decreases from the one end towards the other end, and the shape of the secondary coil of the second transformer is set so the line width of the secondary coil of the second transformer decreases from the one end towards the other end. Thus, it may be greater than about 1 to 4, such as about 1 to 6.

Another preferred embodiment of the present invention provides a laminated balun transformer. The laminated balun transformer includes a first magnetic substrate, a laminated body that includes a transformer including a primary coil and a secondary coil that are laminated on the first magnetic substrate and that face each other, and a second magnetic substrate that is provided on the laminated body, wherein one end of the primary coil of the transformer defines an unbalanced terminal and the other end of the primary coil defines a first balanced terminal, and one end of the secondary coil defines a ground terminal and the other end of the secondary coil defines a second balanced terminal, and wherein the shape of the primary coil of the transformer and the shape of the secondary coil of the transformer are set such that the line width of the primary coil and the line width of the secondary coil increase or decrease from the one end towards the other end. With the above configuration, the shapes of the coils are set such that the line width of the primary coil and the line width of the secondary coil increase from the one end towards the other end. Thus, the ratio of an impedance of the unbalanced terminal side to an impedance of the first and second balanced terminal sides may be less than about 1 to 1, such as about 1 to 0.5. In addition, the shapes of the coils are set so that the line width of the primary coil and the line width of the secondary coil decrease from the one end towards the other end. Thus, the ratio may be greater than about 1 to 1, such as about 1 to 2.

Another preferred embodiment of the present invention provides a laminated balun transformer. The laminated balun transformer includes a first magnetic substrate, a laminated body that includes a first transformer to an nth transformer (where n is integer greater than or equal to 3), which are laminated on the first magnetic substrate and each of which includes a primary coil and a secondary coil that face each other, and a second magnetic substrate that is provided on the laminated body, wherein one end of the primary coil of the first transformer defines an unbalanced terminal and the other end of the primary coil of the first transformer defines a first balanced terminal, one end of the secondary coil of the nth transformer defines a ground terminal and the other end of the secondary coil of the nth transformer defines a second balanced terminal, ends of the secondary coils of the first transformer to (n−1)th transformer are connected to the one end of the secondary coil of the nth transformer, ends of the primary coil of the second transformer to nth transformer are connected to the one end of the primary coil of the first transformer and the other ends of the primary coils of the second transformer to nth transformer are respectively connected to the other ends of the secondary coils of the preceding transformers, and wherein the shape of the primary coil of the first transformer is set such that the line width of the primary coil of the first transformer increases or decreases from the one end towards the other end, and the shape of the secondary coil of the nth transformer is set such that the line width of the secondary coil of the nth transformer increases or decreases from the one end towards the other end. With this configuration, the shape of the primary coil of the first transformer is set such that the line width of the primary coil of the first transformer increases from the one end towards the other end, and the shape of the secondary coil of the nth transformer is set so that the line width of the secondary coil of the nth transformer increases from the one end towards the other end. Thus, the ratio of an impedance of the unbalanced terminal side to an impedance of the balanced terminal sides may be less than about 1 to $n^2$. In addition, the shape of the primary coil of the first transformer is set so that the line width of the primary coil of the first transformer decreases from the one end towards the other end, and the shape of the secondary coil of the nth transformer is set so the line width of the secondary coil of the nth transformer decreases from the one end towards the other end. Thus, the ratio of an impedance of the unbalanced terminal side to an impedance of the balanced terminal sides may be greater than about 1 to $n^2$.

As described in detail above, according to preferred embodiments of the present invention, the ratio of an impedance of the balanced terminal side to the unbalanced terminal may be selectively set to a ratio that corresponds to the impedance of a line to be mounted, not only in discrete values, such as 1, 4, 9, . . . , but also in other values, such as 2, 3, 6, . . . . Thus, it is possible to advantageously provide a versatile laminated balun transformer that may be mounted with low insertion loss in lines having various impedances.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Hereinafter, preferred embodiments of the present invention will be described with reference to the accompanying drawings.

First Preferred Embodiment

Figure 1:
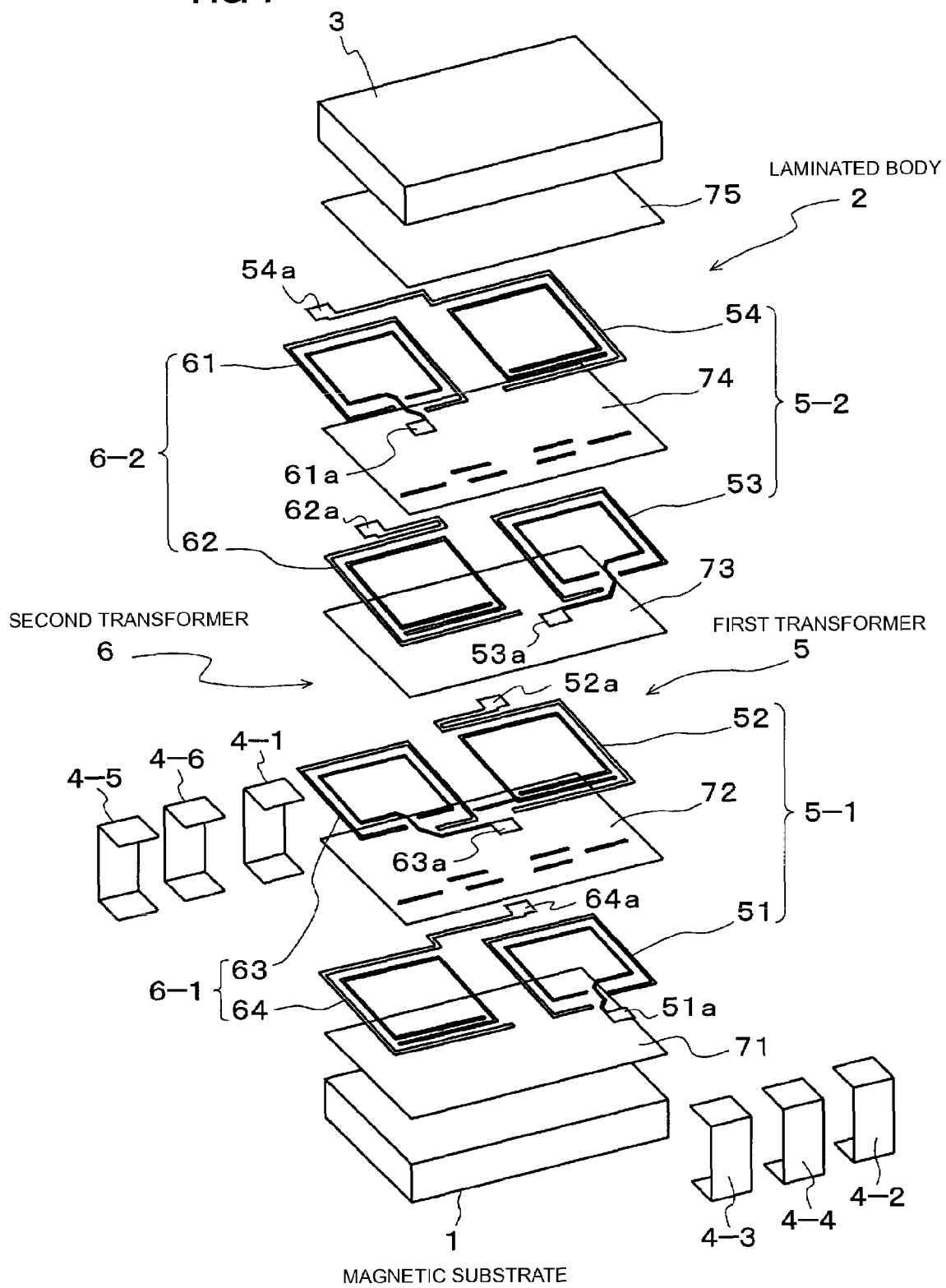
FIG. 1 is an exploded perspective view of a laminated balun transformer according to a first preferred embodiment of the present invention.
Figure 2:
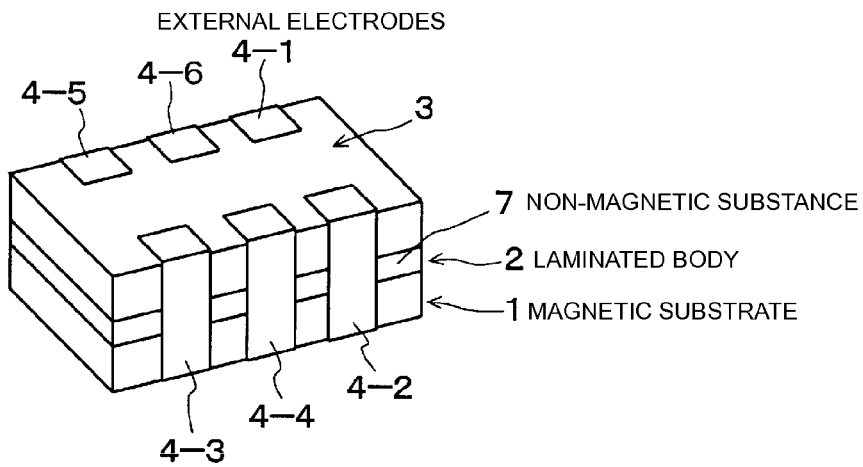
FIG. 2 is an external view of the laminated balun transformer.

FIG. 1 is an exploded perspective view of a laminated balun transformer according to a first preferred embodiment of the present invention. FIG. 2 is an external view of the laminated balun transformer.

As shown in FIG. 2, in this preferred embodiment, a laminated balun transformer includes a magnetic substrate 1 which defines a first magnetic substrate, a laminated body 2 laminated on the magnetic substrate 1, a magnetic substrate 3 which defines a second magnetic substrate that is disposed on the laminated body 2, and external electrodes 4-1 to 4-6.

As shown in FIG. 1, the laminated body 2 includes a first transformer 5, a second transformer 6 that has substantially similar structure to the first transformer 5 and that is arranged in substantially the same direction as the first transformer 5, and an insulator 7 (see FIG. 2) that covers the first and second transformers 5 and 6.

The insulator 7 is, for example, a dielectric substance, and is formed by laminating insulating layers 71 to 75. The first and second transformers 5 and 6 are patterned on the insulating layers 71 to 74. Specifically, the first transformer 5 includes a primary coil 5-1 and a secondary coil 5-2 that face each other in a laminating direction. Then, the primary coil 5-1 includes a conductive pattern 51 and a conductive pattern 52, and the secondary coil 5-2 includes a conductive pattern 53 and a conductive pattern 54. The second transformer 6 also includes a primary coil 6-1 and a secondary coil 6-2 that face each other in a laminating direction. The primary coil 6-1 includes a conductive pattern 63 and a conductive pattern 64, and the secondary coil 6-2 includes a conductive pattern 61 and a conductive pattern 62.

Figure 3:
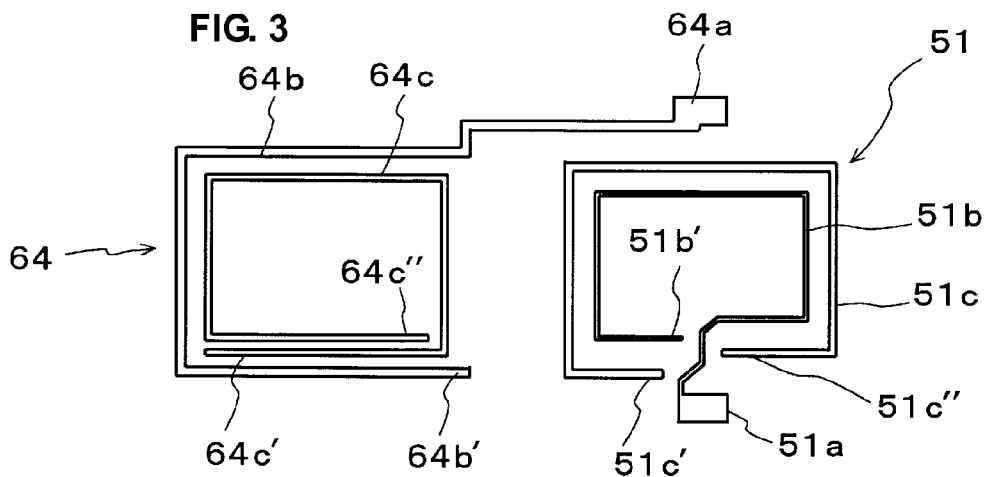
FIG. 3 is a plan view of a conductive pattern in a lowermost layer.
Figure 4:
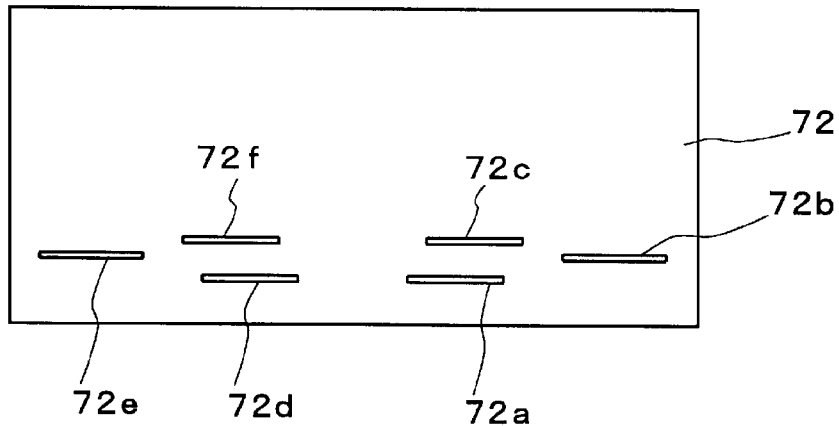
FIG. 4 is a plan view of an insulating layer.
Figure 5:
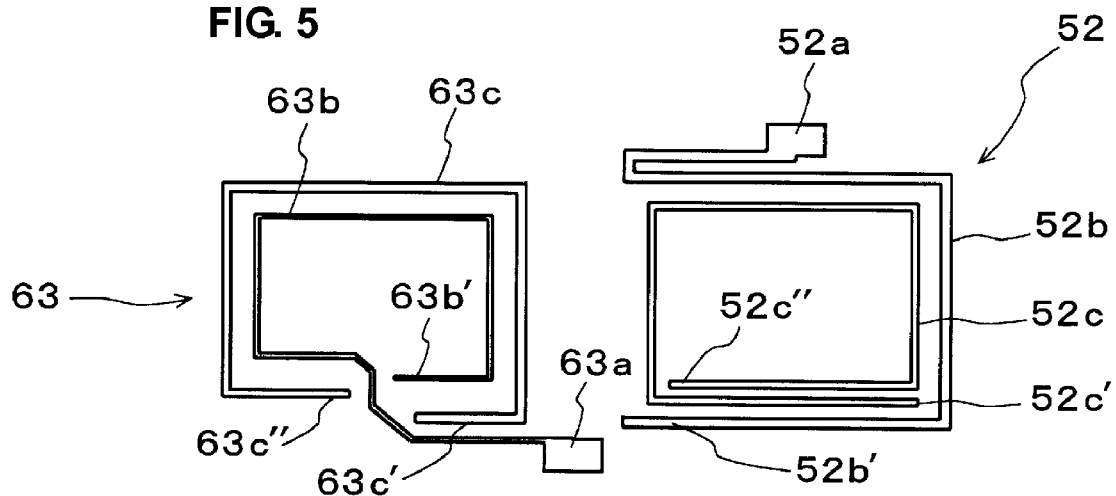
FIG. 5 is a plan view of a conductive pattern in a second layer.
Figure 6:
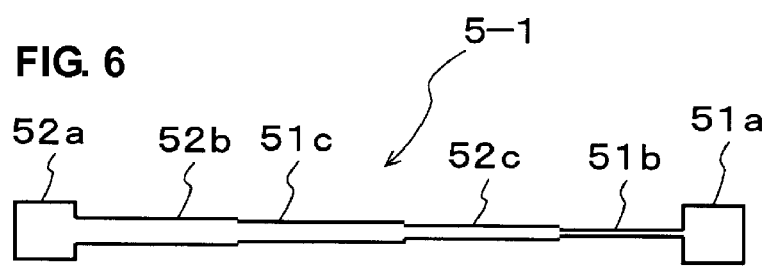
FIG. 6 is a schematic plan view that shows a primary coil of a first transformer.

The structure of the first and second transformers 5 and 6 will be described in detail below. The conductive patterns 51 and 64 are patterned on the insulating layer 71, which is laminated on the magnetic substrate 1, by photolithography, or other suitable method. Then, the insulating layer 72 is laminated on the conductive patterns 51 and 64, and the conductive patterns 52 and 63 are patterned on the insulating layer 72. FIG. 3 is a plan view of the conductive patterns 51 and 64. FIG. 4 is a plan view of the insulating layer 72. FIG. 5 is a plan view of the conductive patterns 52 and 63. FIG. 6 is a schematic plan view that shows the primary coil 5-1 of the first transformer 5. As shown in FIG. 3, the conductive pattern 51 includes a pattern 51$b$ that includes an internal electrode 51$a$ extending from the inside, and an outside pattern 51$c$. In addition, as shown in FIG. 5, the conductive pattern 52 includes a pattern 52$b$ that includes an internal electrode 52$a$ extending to the outside, and an inside pattern 52$c$. An end 52$b$' of the pattern 52$b$ of the conductive pattern 52 is connected to an end 51$c$' of the pattern 51$c$ of the conductive pattern 51 via a through-hole 72$a$ of the insulating layer 72 shown in FIG. 4. In addition, an end 51$c$" of the pattern 51$c$ is connected to an end 52$c$' of the pattern 52$c$ via a through-hole 72$b$, and an end 52$c$" of the pattern 52$c$ is connected to an end 51$b$' of the pattern 51$b$ via a through-hole 72$c$. In this manner, the spiral primary coil 5-1 is provided such that the internal electrodes 51$a$ and 52$a$ define both ends thereof.

However, in this preferred embodiment, the spiral primary coil 5-1 is arranged such that the line width of the pattern 52$b$ is the largest, the line widths of the patterns 51$c$ and 52$c$ sequentially decrease in this order, and the line width of the pattern 51$b$ is the smallest. That is, in the primary coil 5-1 of the first transformer 5 as shown in FIG. 6, the line width decreases from the side of the internal electrode 52$a$, which is one end, towards the side of the internal electrode 51$a$, which is the other end.

As shown in FIG. 3, the conductive pattern 64 includes a pattern 64$b$ that includes an internal electrode 64$a$ extending to an outside central portion (i.e., a location substantially corresponding to the internal electrode 52$a$) of the adjacent conductive pattern 51, and an inside pattern 64$c$. In addition, as shown in FIG. 5, the conductive pattern 63 includes a pattern 63$b$ that includes an internal electrode 63$a$ extending from the inside to the central portion between the conductive patterns 52 and 63, and an outside pattern 63$c$. Then, an end 64$b$' of the pattern 64$b$ is connected to an end 63$c$' of the pattern 63$c$ via a through-hole 72$d$. An end 63$c$" of the pattern 63$c$ is connected to an end 64$c$" of the pattern 64$c$ via a through-hole 72$e$, and an end 64$c$" of the pattern 64$c$ is connected to an end 63$b$' of the pattern 63$b$ via a through-hole 72$f$. In this manner, the spiral primary coil 6-1 is provided such that the internal electrodes 64$a$ and 63$a$ define both ends and the line width decreases from the side of the internal electrode 64$a$ towards the side of the internal electrode 63$a$.

Figure 7:
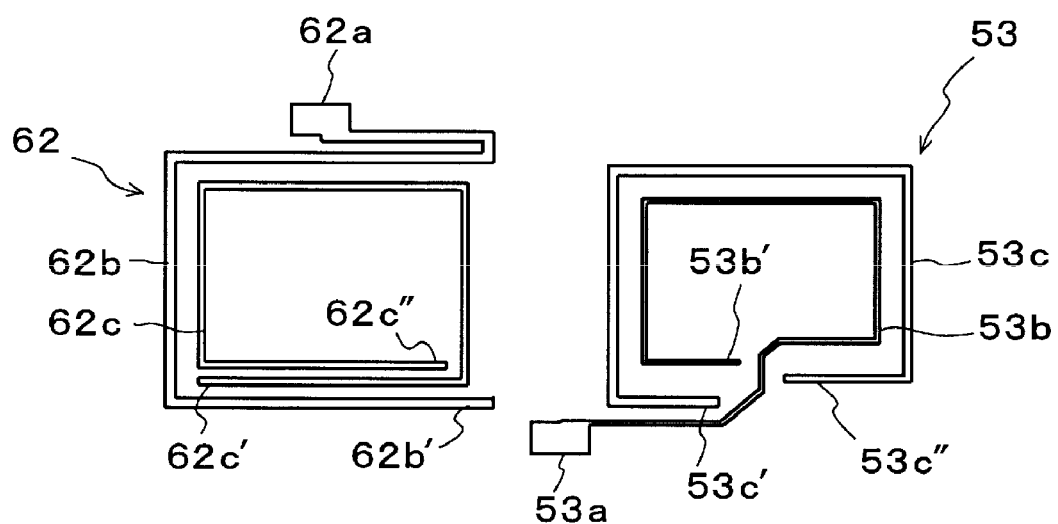
FIG. 7 is a plan view of a conductive pattern in a third layer.
Figure 8:
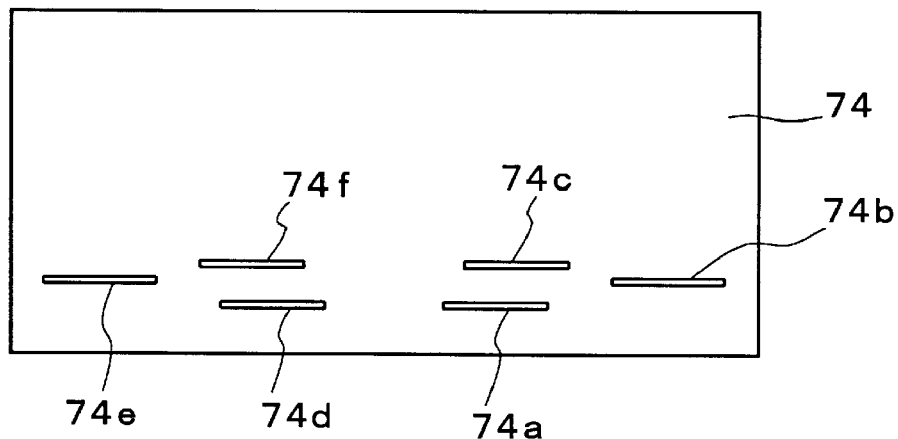
FIG. 8 is a plan view of an insulating layer.
Figure 9:
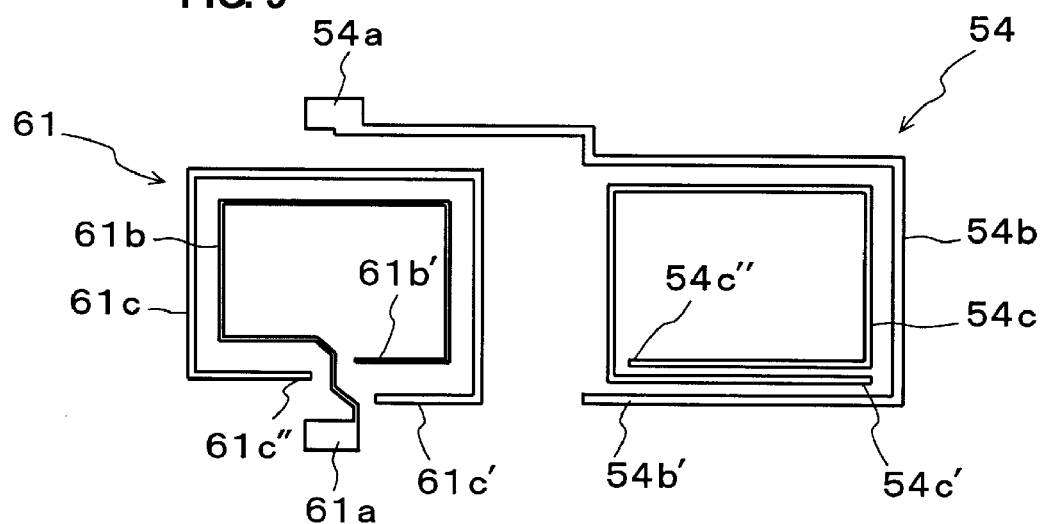
FIG. 9 is a plan view of a conductive pattern in an uppermost layer.
Figure 10:
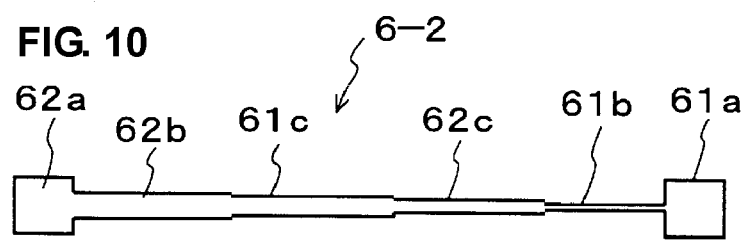
FIG. 10 is a schematic plan view that shows a secondary coil of a second transformer.

As shown in FIG. 1, the conductive patterns 53 and 62 are patterned on the insulating layer 73 that is laminated on the conductive patterns 52 and 63. Then, the insulating layer 74 is laminated on the conductive patterns 53 and 62, and the conductive patterns 54 and 61 are patterned on the insulating layer 74. FIG. 7 is a plan view of the conductive patterns 53 and 62. FIG. 8 is a plan view of the insulating layer 74. FIG. 9 is a plan view of the conductive patterns 54 and 61. FIG. 10 is a schematic plan view that shows the secondary coil 6-2 of the second transformer 6. As shown in FIG. 7, the conductive pattern 53 includes an internal electrode 53$a$ extending from the inside to the central portion between the conductive patterns 53 and 62, and an outside pattern 5$cc$. In addition, the conductive pattern 54 includes a pattern 54$b$ that includes an internal electrode 54$a$ extending to the outside central portion (i.e., a location corresponding to the internal electrode 62$a$) of the adjacent conductive pattern 61, and an inside pattern 54$c$. Then, an end 54$b$' of the pattern 54$b$ of the conductive pattern 54 is connected to an end 53$c$' of the pattern 53$c$ of the conductive pattern 53 via a through-hole 74$a$ of the insulating layer 74 shown in FIG. 8. In addition, an end 53$c$" of the pattern 53$c$ is connected to an end 54$c$' of the pattern 54$c$ via a through-hole 74$b$, and an end 54$c$" of the pattern 54$c$ is connected to an end 53$b$' of the pattern 53$b$ via a through-hole 74$c$. In this manner, the spiral secondary coil 5-2 is arranged such that the internal electrodes 54$a$ and 53$a$ defines both ends and the line width decreases from the side of the internal electrode 54$a$ towards the side of the internal electrode 53$a$.

As shown in FIG. 7, the conductive pattern 62 includes a pattern 62$b$ that includes an internal electrode 62$a$ extending to the outside, and an inside pattern 62$c$. In addition, as shown in FIG. 9, the conductive pattern 61 includes a pattern 61$b$ that includes an internal electrode 61$a$ extending from the inside, and an outside pattern 61$c$. Then, an end 62$b$' of the pattern 62$b$ is connected to an end 61$c$' of the pattern 61$c$ via a through-hole 74$d$. An end 61$c$' of the pattern 61$c$ is connected to an end 62$c$' of the pattern 62$c$ via a through-hole 74$e$, and an end 62$c$" of the pattern 62$c$ is connected to an end 61$b$' of the pattern 61$b$ via a through-hole 74$f$. In this manner, the spiral secondary coil 6-2 is provided such that the internal electrodes 62$a$ and 61$a$ define both ends.

In this preferred embodiment, the line width of the pattern 62$b$ is the largest, the line widths of the patterns 61$c$ and 62$c$ sequentially decreases in this order, and the line width of the pattern 61$b$ is the smallest. That is, as shown in FIG. 10, in the secondary coil 6-2 of the second transformer 6, the shape of the secondary coil 6-2 is set such that the line width decreases from the side of the internal electrode 62$a$ towards the side of the internal electrode 61$a$. Then, as shown in FIG. 1, the insulating layer 75 is laminated on the conductive patterns 54 and 61, and the magnetic substrate 3 is disposed on the insulating layer 75.

The external electrodes 4-1 to 4-6 are provided on the side surface of a chip body having the above-described structure. Specifically, the external electrode 4-1 is electrically connected to both the internal electrodes 52$a$ and 64$a$ of the conductive patterns 52 and 64, and the external electrode 4-2 is electrically connected to the internal electrode 51$a$ of the conductive pattern 51. The external electrode 4-3 is electrically connected to the internal electrode 61$a$ of the conductive pattern 61, the external electrode 4-4 is electrically connected to both the internal electrodes 53$a$ and 63$a$ of the conductive patterns 53 and 63, and the external electrode 4-5 is electrically connected to both the internal electrodes 54$a$ and 62$a$ of the conductive patterns 54 and 62.

Figure 11:
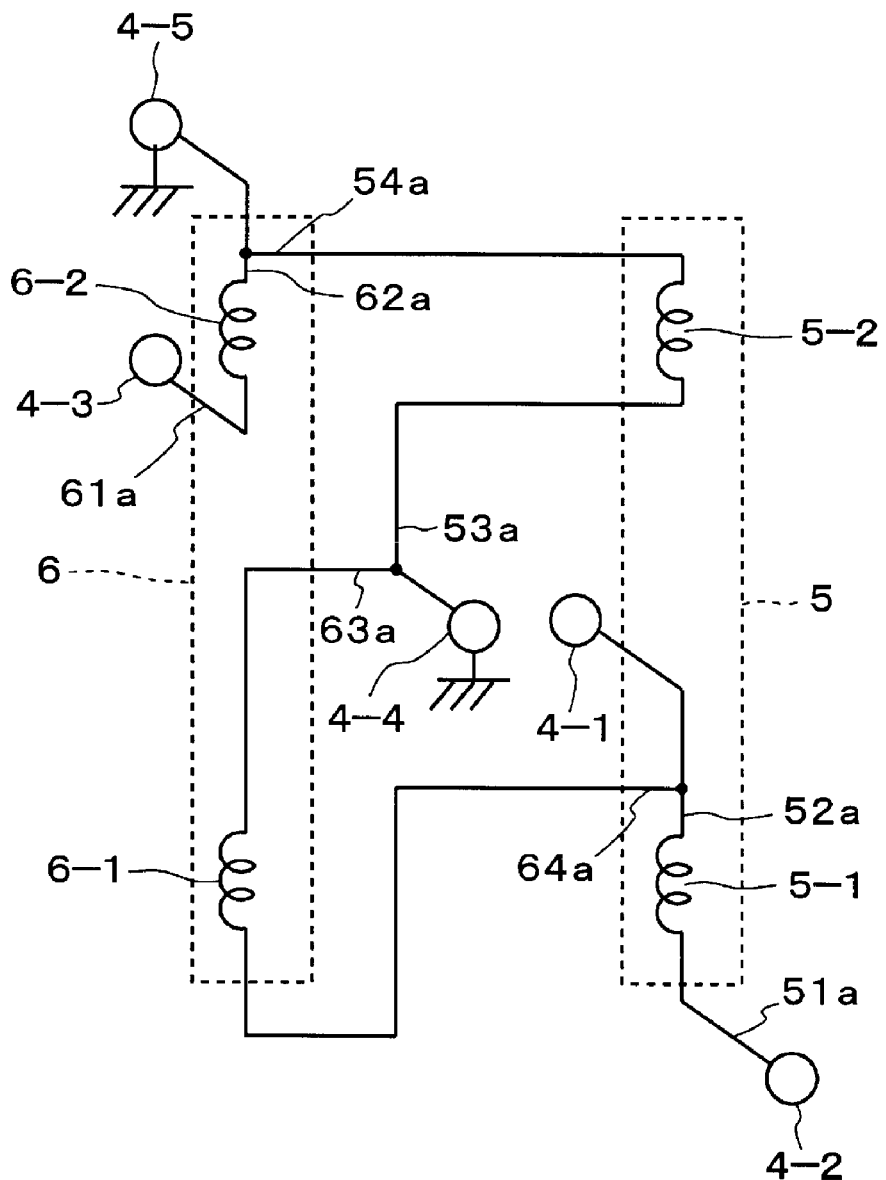
FIG. 11 is a schematic view that shows the electrical configuration of the first and second transformers.
Figure 22:
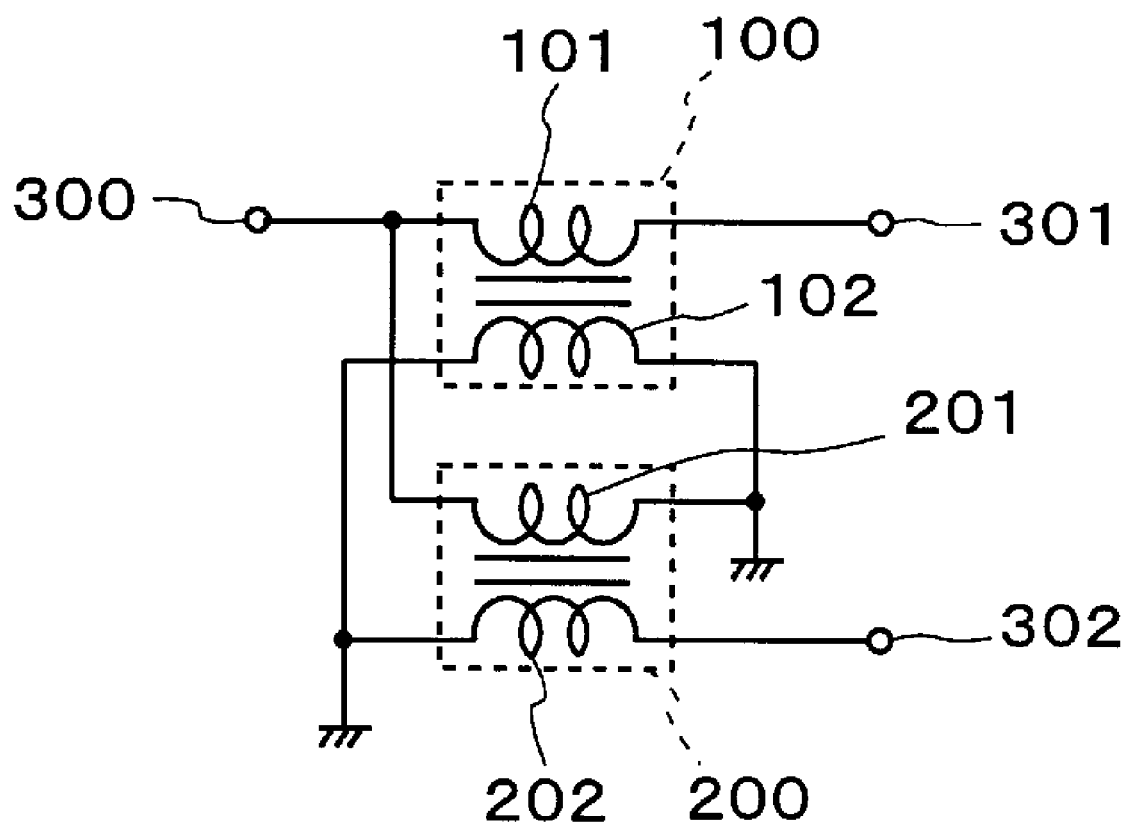
FIG. 22 is an equivalent circuit diagram of a 1 to 4 balun transformer according to the related art.

FIG. 11 is a schematic view that shows the electrical configuration of the first and second transformers 5 and 6. With the above-described connection between the conductive patterns and the connection between the external electrodes 4-1 to 4-6 and the internal electrodes, the circuit configuration shown in FIG. 11 is provided. That is, the external electrode 4-1, which is connected to the internal electrode 52$a$ of the primary coil 5-1 of the first transformer 5, defines an unbalanced terminal, and the external electrode 4-2, which is connected to the internal electrode 51a, defines a first balanced terminal. Then, the external electrodes 4-4 and 4-5, which are connected to the internal electrodes 53a and 54a that define both ends of the secondary coils 5-2, define ground terminals. In addition, the internal electrode 64a of the primary coil 6-1 of the second transformer 6 is connected to the internal electrode 52a. The internal electrode 63a is connected to the internal electrode 53a of the secondary coil 5-2 of the first transformer 5 via the external electrode 4-4. Then, the internal electrode 62a of the secondary coil 6-2 is connected to the internal electrode 54a of the secondary coil 5-2 of the first transformer 5. In addition, the external electrode 4-3, which is connected to the internal electrode 61a of the secondary coil 6-2, defines a second balanced terminal. This circuit configuration is similar to the configuration of the 1 to 4 balun transformer shown in FIG. 22. However, as shown in FIG. 6 and FIG. 10, the laminated balun transformer of this preferred embodiment is configured such that the line width of the primary coil 5-1 of the first transformer 5 is set so as to decrease from the side of the internal electrode 52a towards the side of the internal electrode 51a, and the line width of the secondary coil 6-2 of the second transformer 6 is set so as to decrease from the side of the internal electrode 62a towards the side of the internal electrode 61a. Thus, in FIG. 1, the ratio of an impedance of the side of the external electrode 4-1, which is the unbalanced terminal, to an impedance of the sides of the external electrodes 4-2 and 4-3, which are the first and second balanced terminals, may preferably be set to be greater than about 1 to 4, such as 1 to 5 or 1 to 6, for example.

Figure 12:
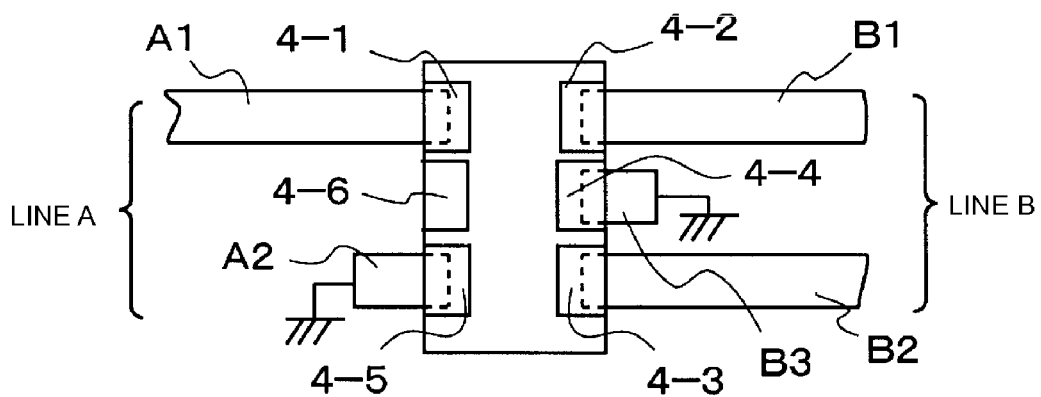
FIG. 12 is a plan view that shows a state in which the laminated balun transformer is mounted on lines.

Next, the function and the advantages achieved with the laminated balun transformer according to this preferred embodiment will be described. FIG. 12 is a plan view that shows a state in which the laminated balun transformer is mounted on lines. In FIG. 12, when the characteristic impedance of a line A defined by a signal line A1 and a ground line A2 is about 50Ω, and the characteristic impedance of a line b defined by signal lines B1 and B2 and a ground line B3 is about 200Ω, the 1 to 4 laminated balun transformer shown in FIG. 22 may be used. However, in actual lines, the ratio of characteristic impedances between the line A side and the line B side does not have the ratio of about 1 to 4 and significantly deviates from the ratio of about 1 to 4 in many cases. Even when the existing laminated balun transformer is mounted on the lines, an appropriate balanced characteristic cannot be obtained, and the insertion loss thereof is increased accordingly. In contrast, in the laminated balun transformer according to this preferred embodiment, as described above, the ratio of an impedance of the side of the external electrode 4-1, which is the unbalanced terminal, to an impedance of the sides of the external electrodes 4-2 and 4-3, which are the first and second balanced terminals, is preferably set to about 1 to 6, for example. Thus, significantly less insertion loss is produced. Specifically, a variation in line width of the primary coil 5-1 of the first transformer 5 and a variation in line width of the secondary coil 6-2 of the second transformer 6 are appropriately set, and the ratio of an impedance of the side of the external electrode 4-1 to an impedance of the sides of the external electrodes 4-2 and 4-3 is preferably set to about 1 to 6, for example. Then, as shown in FIG. 12, the external electrode 4-1, which is the unbalanced terminal, is connected to a signal line A1 of the line A side, and the external electrode 4-5 is connected to a ground line A2. The external electrodes 4-2 and 4-3, which define the first and second balanced terminals, are connected to signal lines B1 and B2 of the line B side, and the external electrode 4-4 is connected to a ground line B3. Thus, the laminated balun transformer provides an appropriate balanced characteristic.

The inventors of preferred embodiments of the present invention performed a simulation in order to confirm the above-described assumption. In the simulation, first, a 1 to 4 laminated balun transformer is configured such that the line width of the primary coil 5-1 of the first transformer 5 and the line width of the secondary coil 6-2 of the second transformer 6 are not varied as shown in FIG. 6 or FIG. 10 and the line widths are substantially uniform, and the 1 to 4 laminated balun transformer is mounted between the about 50Ω line A and the about 300Ω line B. Then, insertion losses (dB) with respect to high frequencies of about 470 MHz, about 750 MHz and about 790 MHz were calculated. After that, in the 1 to 4 laminated balun transformer, insertion losses were about −0.894 dB, about −1.052 dB, and about −1.085 dB with respect to high frequencies of about 470 MHz, about 750 MHz and about 790 MHz. Next, the laminated balun transformer of this preferred embodiment is configured such that the line width of the primary coil 5-1 of the first transformer 5 and the line width of the secondary coil 6-2 of the second transformer 6 are varied as shown in FIG. 6 or FIG. 10 such that the ratio of the impedances is set to about 1 to 6, and the laminated balun transformer is mounted between the about 50Ω line A and the about 300Ω line B. Then, insertion losses (dB) with respect to high frequencies of about 470 MHz, about 750 MHz and about 790 MHz were calculated. In the laminated balun transformer of this preferred embodiment, insertion losses with respect to high frequencies of about 470 MHz, about 750 MHz and about 790 MHz were respectively about −0.864 dB, about −0.909 dB and about −0.923 dB. Thus, it was confirmed that the insertion losses were significantly reduced so as to be extremely small.

In this manner, according to the laminated balun transformer of this preferred embodiment, the ratio of an impedance of the balanced terminal side to the unbalanced terminal may preferably be selectively set to a ratio that conforms to the impedance of lines to be mounted, such as 5, 6, and 7, for example. Thus, the laminated balun transformer may be mounted with low insertion loss in lines having various impedances. Note that in this preferred embodiment, the illustrated laminated balun transformer is configured such that not only the line width of the primary coil 5-1 of the first transformer 5 and the line width of the secondary coil 6-2 of the second transformer 6, but also the line width of the secondary coil 5-2 of the first transformer 5 and the line width of the primary coil 6-1 of the second transformer 6, are preferably varied as shown in FIG. 6 or FIG. 10. However, even when a laminated balun transformer is configured such that only the line width of the primary coil 5-1 and the line width of the secondary coil 6-2 are varied and the line width of the secondary coil 5-2 and the line width of the primary coil 6-1 are uniform, substantially similar functions and advantages as those of this preferred embodiment are obtained.

Second Preferred Embodiment

Figure 13:
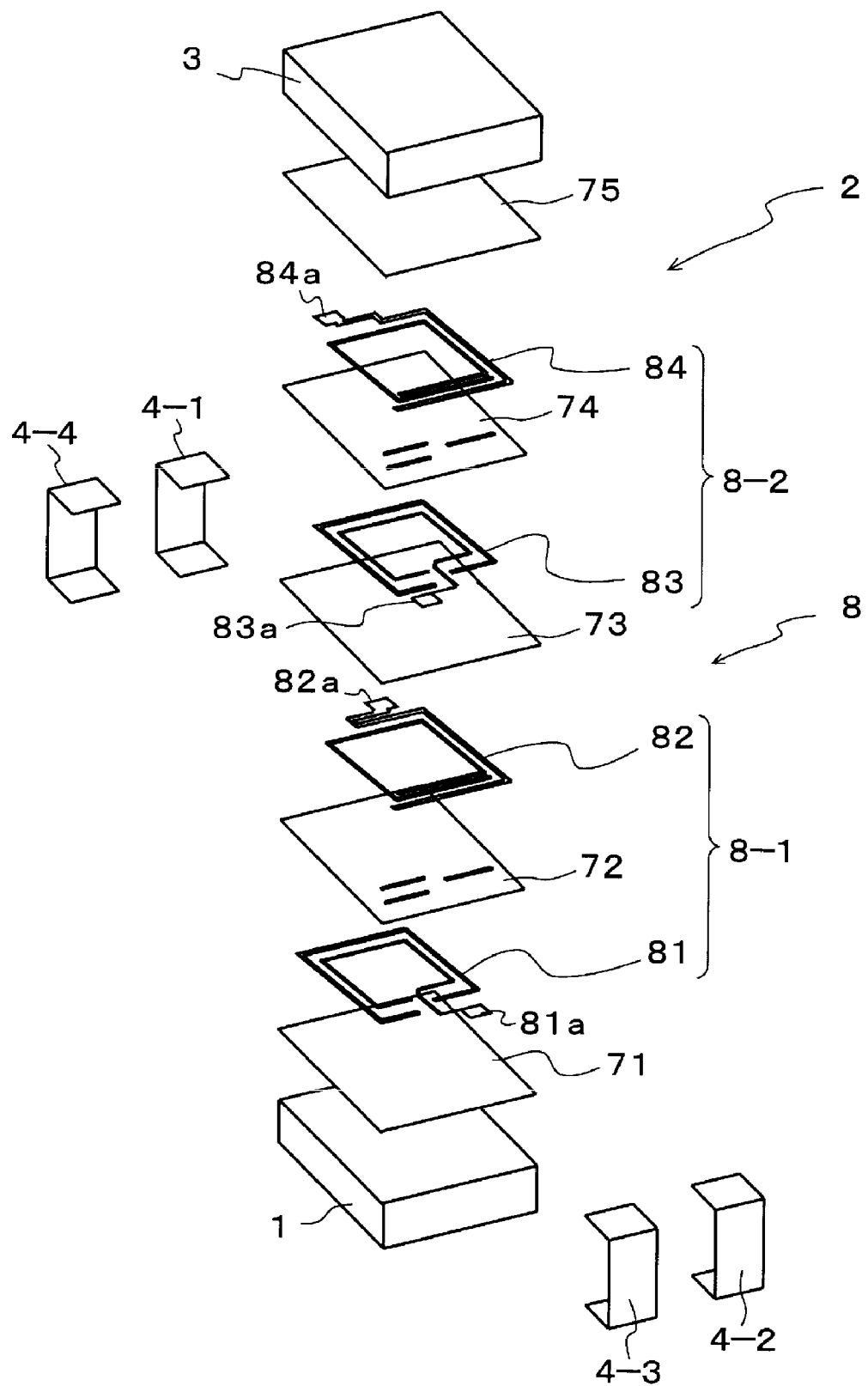
FIG. 13 is an exploded perspective view of a laminated balun transformer according to a second preferred embodiment of the present invention.
Figure 14:
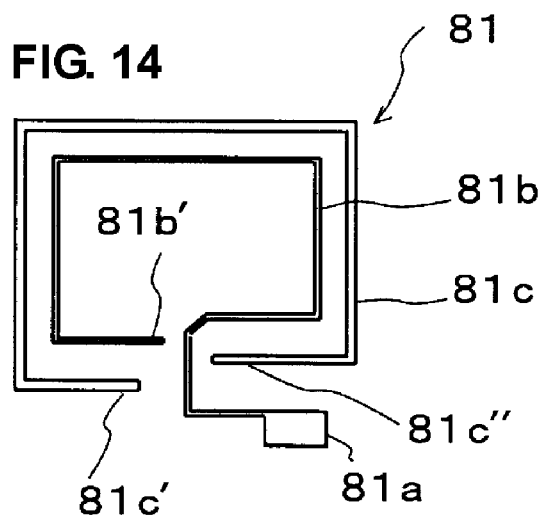
FIG. 14 is a plan view that shows a lower-layer conductive pattern of a primary coil.
Figure 15:
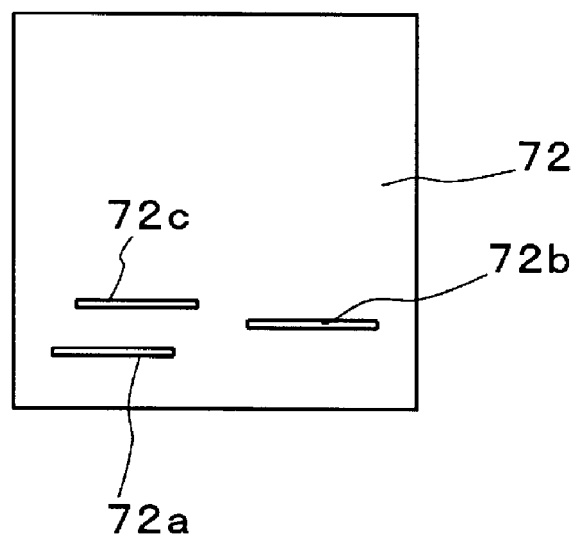
FIG. 15 is a plan view that shows an intermediate insulating layer.
Figure 16:
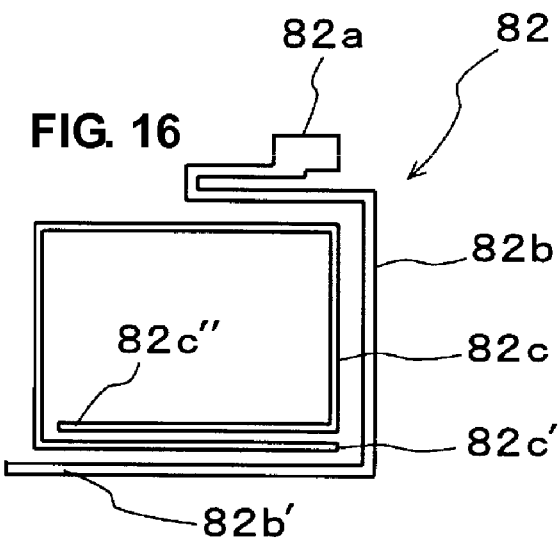
FIG. 16 is a plan view that shows an upper-layer conductive pattern of the primary coil.
Figure 17:
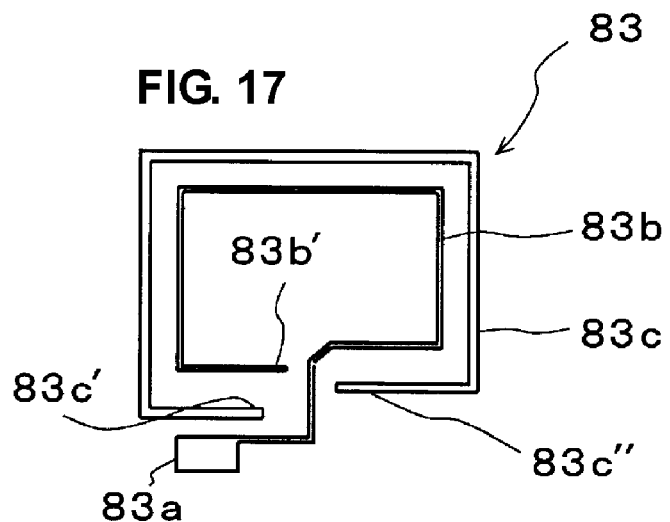
FIG. 17 is a plan view that shows a lower-layer conductive pattern of a secondary coil.
Figure 18:
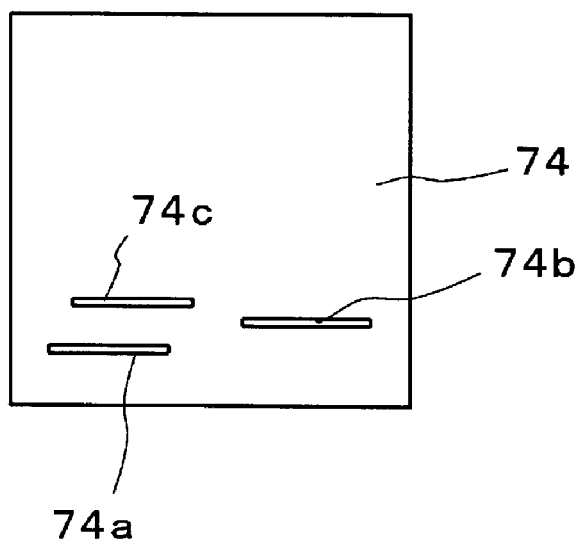
FIG. 18 is a plan view that shows an intermediate insulating layer.
Figure 19:
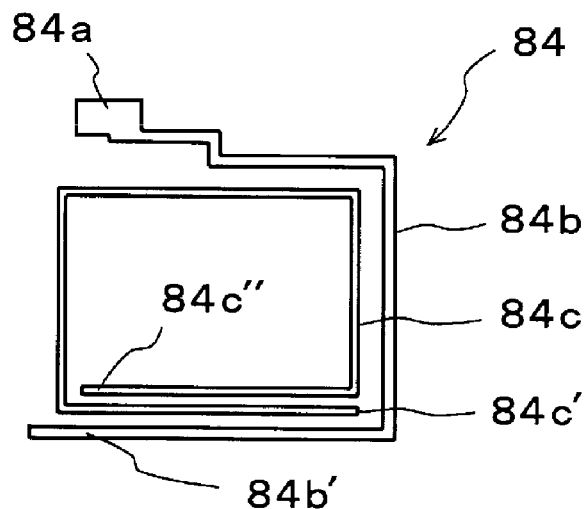
FIG. 19 is a plan view that shows an upper-layer conductive pattern of the secondary coil.

Next, a second preferred embodiment of the present invention will be described. FIG. 13 is an exploded perspective view of a laminated balun transformer according to a second preferred embodiment of the present invention. FIG. 14 is a plan view that shows a lower-layer conductive pattern of a primary coil 8-1. FIG. 15 is a plan view that shows an intermediate insulating layer 72. FIG. 16 is a plan view that shows an upper-layer conductive pattern of the primary coil 8-1. FIG. 17 is a plan view that shows a lower-layer conductive pattern of a secondary coil 8-2. FIG. 18 is a plan view that shows an intermediate insulating layer 74. FIG. 19 is a plan view that shows an upper-layer conductive pattern of the secondary coil 8-2.

As shown in FIG. 13, the laminated balun transformer according to this preferred embodiment is configured such that a laminated body 2 that includes a transformer 8 is disposed between magnetic substrates 1 and 3, and four terminal electrodes 4-1 to 4-4 are provided on the side surfaces. Specifically, the transformer 8 includes a primary coil 8-1 and a secondary coil 8-2 that substantially vertically face each other, the primary coil 8-1 includes a conductive pattern 81 and a conductive pattern 82, and the secondary coil 8-2 includes a conductive pattern 83 and a conductive pattern 84. As shown in FIG. 14, the conductive pattern 81 includes a pattern 81b that includes an internal electrode 81a extending from the inside, and an outside pattern 81c. In addition, as shown in FIG. 16, the conductive pattern 82 includes a pattern 82b that includes an internal electrode 82a extending to the outside, and an inside pattern 82c. An end 82b' of the pattern 82b of the conductive pattern 82 is connected to an end 81c' of the pattern 81c of the conductive pattern 81 via a through-hole 72a of an insulating layer 72 shown in FIG. 15. An end 81c" of the pattern 81c is connected to an end 82c' of the pattern 82c via a through-hole 72b, and an end 82c" of the pattern 82c is connected to an end 81b' of the pattern 81b via a through-hole 72c. In this manner, the spiral primary coil 8-1 is arranged such that the internal electrodes 81a and 82a define both ends.

The primary coil 8-1 is also configured such that the line width of the pattern 82b is the largest, the line widths of the patterns 81c and 82c sequentially decrease in this order, and the line width of the pattern 81b is the smallest, and the line width decreases from the side of the internal electrode 82a, towards the side of the internal electrode 81a.

As shown in FIG. 13, the conductive patterns 83 and 84 are arranged above the conductive patterns 81 and 82 via an insulating layer 73. As shown in FIG. 17, the conductive pattern 83 includes a pattern 83b that includes an internal electrode 83a extending from the inside, and an outside pattern 83c. As shown in FIG. 19, the conductive pattern 84 includes a pattern 84b that includes an internal electrode 84a extending to the outside, and an inside pattern 84c. An end 84b' of the pattern 84b of the conductive pattern 84 is connected to an end 83c' of the pattern 84c of the conductive pattern 83 via a through-hole 74a of an insulating layer 74 shown in FIG. 18. In addition, an end 83c" of the pattern 83c is connected to an end 84c' of the pattern 84c via a through-hole 74b, and an end 84c" of the pattern 84c is connected to an end 83b' of the pattern 83b via a through-hole 74c. In this manner, the spiral secondary coil 8-2 is arranged such that the internal electrodes 83a and 84a define both ends.

The secondary coil 8-2 is configured such that the line width of the pattern 84b is the largest, the line widths of the patterns 83c and 84c sequentially decreases in this order, and the line width of the pattern 83b is the smallest, and the line width decreases from the side of the internal electrode 84a towards the side of the internal electrode 83a.

As shown in FIG. 13, the external electrode 4-1 is electrically connected to the internal electrode 82a of the conductive pattern 82, and the external electrode 4-2 is electrically connected to the internal electrode 81a of the conductive pattern 81. Then, the external electrode 4-3 is electrically connected to the internal electrode 83a of the conductive pattern 83, and the external electrode 4-4 is electrically connected to the internal electrode 84a of the conductive pattern 84.

Figure 20:
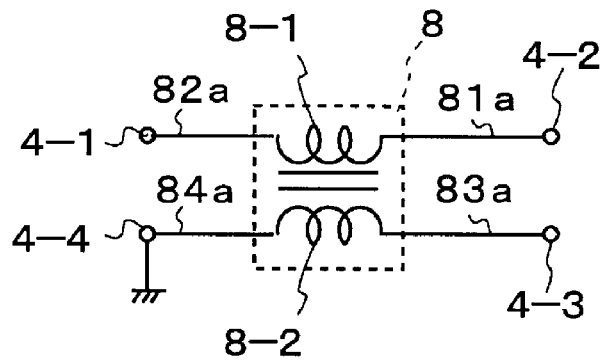
FIG. 20 is an equivalent circuit diagram of a laminated balun transformer according to the second preferred embodiment of the present invention.

FIG. 20 is an equivalent circuit diagram of the laminated balun transformer according to the second preferred embodiment. As shown in FIG. 20, the external electrode 4-1, which is connected to the internal electrode 82a of the primary coil 8-1, defines an unbalanced terminal, and the external electrode 4-2, which is connected to the internal electrode 61a, defines a first balanced terminal. The external electrode 4-3, which is connected to the internal electrode 83a of the secondary coil 8-2, defines a second balanced terminal, and the external electrode 4-4, which is connected to the internal electrode 84a, defines a ground terminal, thus providing a structure that is similar to a 1 to 1 balun transformer. However, the laminated balun transformer of this preferred embodiment is arranged such that the line width of the primary coil 8-1 of the transformer 8 decreases from the side of the internal electrode 82a towards the side of the internal electrode 81a, and the line width of the secondary coil 8-2 also decreases from the side of the internal electrode 84a towards the side of the internal electrode 83a. Thus, the ratio of an impedance of the side of the external electrode 4-1, which is the unbalanced terminal, to an impedance of the sides of the external electrodes 4-2 and 4-3, which are the first and second terminals, may preferably be set to be greater than about 1 to 1, such as about 1 to 1.5 or about 1 to 2.0, for example.

Conversely, when the external electrode 4-2 defines an unbalanced terminal, the external electrode 4-3 define a ground terminal, and the external electrodes 4-1 and 4-4 define first and second balanced terminals, the ratio of an impedance of the side of the external electrode 4-2, which is the unbalanced terminal, to an impedance of the side of the external electrodes 4-1 and 4-4, which are the first and second balanced terminals, may preferably be set to be less than about 1 to 1, such as about 1 to 0.75 or about 1 to 0.5, for example. The other configuration, function and advantages are similar to those of the first preferred embodiment, so the description thereof is omitted.

Third Preferred Embodiment

Figure 21:
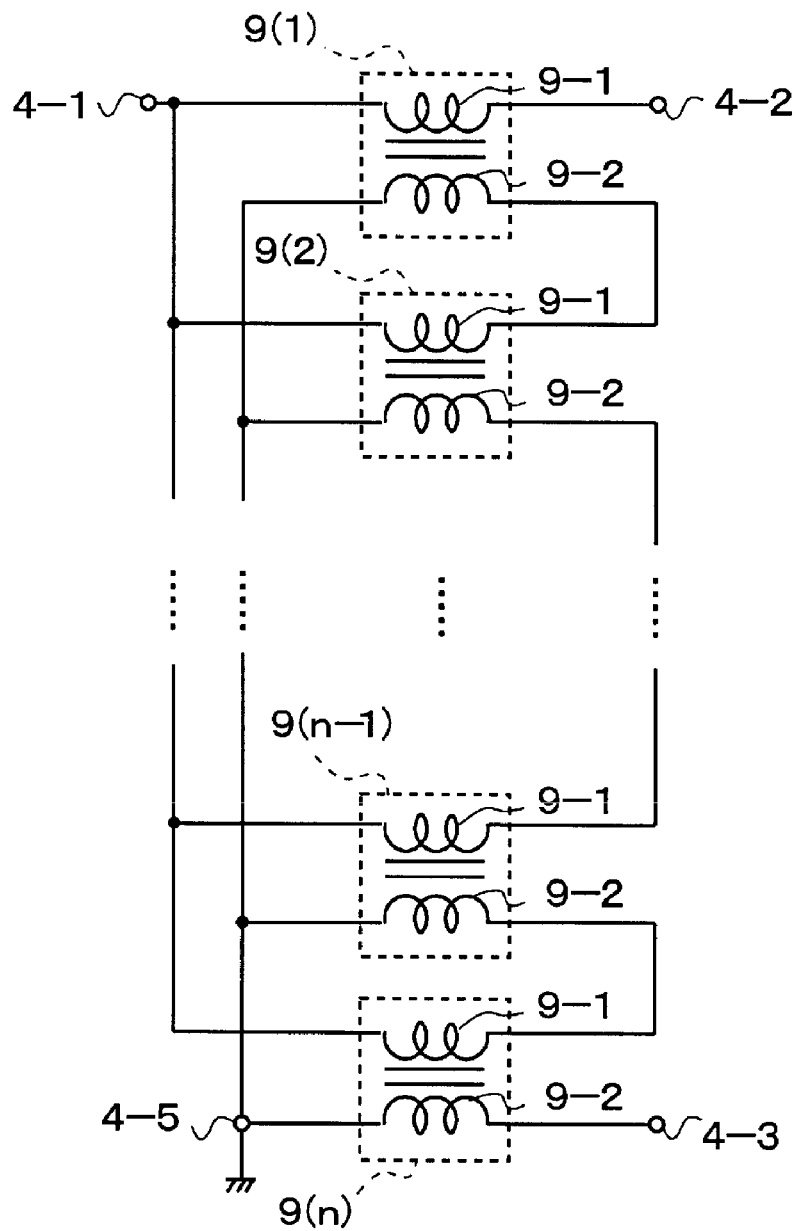
FIG. 21 is an equivalent circuit diagram of a laminated balun transformer according to a third preferred embodiment of the present invention.

Next, a third preferred embodiment of the present invention will be described. FIG. 21 is an equivalent circuit diagram of a laminated balun transformer according to a third preferred embodiment of the present invention. In this preferred embodiment, as in the case of the laminated balun transformer shown in FIG. 1, in the structure in which a laminated body 2 is disposed between magnetic substrates 1 and 3, and external electrodes 4-1 to 4-6 are provided on the side surfaces, as shown in FIG. 21, n (where n is integer greater than or equal to 3) numbers of first transformer 9(1) to nth transformer 9(n) are incorporated in the laminated body 2.

Specifically, the left end of a primary coil 9-1 of the first transformer 9(1) is connected to the external electrode 4-1 to define an unbalanced terminal, and the right end thereof is connected to the external electrode 4-2 to define a first balanced terminal. In addition, in the last nth transformer 9(n), the left end of a secondary coil 9-2 is connected to the external electrode 4-5 to define a ground terminal, and the right end thereof is connected to the external electrode 4-3 to define a second balanced terminal. Then, the left end of each of the secondary coils 9-2 of the first transformer 9(1) to (n−1)th transformer 9(n−1) is connected to the left end of the secondary coil 9-2 of the nth transformer 9(n). That is, the left ends of all the secondary coils 9-2 of the first transformer 9(1) to nth transformer 9(n) are connected to the external electrode 4-5 to define ground terminals. In addition, the left end of each of the primary coils 9-1 of the second transformer 9(2) to nth transformer 9(n) is connected to the left end of the left end of the primary coil 9-1 of the first transformer 9(1). That is, the left ends of all the primary coils 9-1 of the first transformer 9(1) to nth transformer 9(n) are connected to the external electrode 4-1 to define an unbalanced terminal. Then, the right ends of the primary coils 9-1 of the second transformer 9(2) to nth transformer 9(n) are respectively connected to the right ends of the secondary coils 9-2 of the preceding transformers 9(1) to 9(n−1).

In the above electrical circuit configuration, when the line widths of the primary and secondary coils 9-1 and 9-2 are uniform, the laminated balun transformer is a 1 to $n^2$ laminated balun transformer. However, in this preferred embodiment, as in the first and second preferred embodiments, the line width of the primary coil 9-1 of the first transformer 9(1) is set so as to increase or decrease from the left end towards the right end, and the line width of the secondary coil 9-2 of the nth transformer 9(n) is set so as to increase or decrease from the left end towards the right end. That is, the line widths of these coils are increased or decreased from the unbalanced terminal side towards the first and second balanced terminals side. In this manner, when the line width of the primary coil 9-1 of the first transformer 9(1) and the line width of the secondary coil 9-2 of the nth transformer 9(n) are increased from the unbalanced terminal side towards the first and second balanced terminals side, the ratio of an impedance of the side of the external electrode 4-1 to an impedance of the sides of the external electrodes 4-2 and 4-3 may be less than about 1 to $n^2$. Conversely, when the line width is decreased from the unbalanced terminal side towards the first and second balanced terminals side, the ratio of an impedance of the side of the external electrode 4-1 to an impedance of the side of the external electrodes 4-2 and 4-3 may be greater than about 1 to $n^2$. The other configuration, function and advantages are similar to those of the first and second preferred embodiments, so the description thereof is omitted.

Note that the present invention is not limited to the preferred embodiments described above, and may be modified or changed in various manner within the scope of the invention. For example, in the first preferred embodiment, the illustrated laminated balun transformer includes the coils of which the line widths are decreased from the unbalanced terminal side towards the first and second balanced terminals side. However, the laminated balun transformer is not limited to this configuration. A laminated balun transformer that includes coils of which the line widths are increased from the unbalanced terminal side towards the first and second balanced terminals side may also be included.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A laminated balun transformer comprising:
  a first magnetic substrate;
  a laminated body including a first transformer and a second transformer, each of which includes a primary coil and a secondary coil that are laminated on the first magnetic substrate and that face each other; and
  a second magnetic substrate provided on the laminated body; wherein
  one end of the primary coil of the first transformer defines an unbalanced terminal and the other end of the primary coil defines a first balanced terminal, one end and the other end of the secondary coil respectively define ground terminals, one end of the primary coil of the second transformer is connected to the one end of the primary coil of the first transformer and the other end of the primary coil of the first transformer is connected to the secondary coil of the first transformer, one end of the secondary coil of the second transformer is connected to the one end of the secondary coil of the first transformer and the other end of the secondary coil of the second transformer defines a second balanced terminal; and
  a shape of the primary coil of the first transformer is set such that a line width of the primary coil of the first transformer increases or decreases from the one end towards the other end, and a shape of the secondary coil of the second transformer is set such that the line width of the secondary coil of the second transformer increases or decreases from the one end towards the other end.

2. A laminated balun transformer comprising:
  a first magnetic substrate;
  a laminated body including a transformer that includes a primary coil and a secondary coil that are laminated on the first magnetic substrate and that face each other; and
  a second magnetic substrate provided on the laminated body; wherein
  one end of the primary coil of the transformer defines an unbalanced terminal and the other end of the primary coil defines a first balanced terminal, and one end of the secondary coil defines a ground terminal and the other end of the secondary coil defines a second balanced terminal; and
  a shape of the primary coil of the transformer and a shape of the secondary coil of the transformer are set so that a line width of the primary coil and the line width of the secondary coil increase or decrease from the one end towards the other end.

3. A laminated balun transformer comprising:
  a first magnetic substrate;
  a laminated body including a first transformer to an nth transformer, where n is integer greater than or equal to 3, which are laminated on the first magnetic substrate and each of which includes a primary coil and a secondary coil that face each other; and
  a second magnetic substrate that is provided on the laminated body; wherein
  one end of the primary coil of the first transformer defines an unbalanced terminal and the other end of the primary coil of the first transformer defines a first balanced terminal, one end of the secondary coil of the nth transformer defines a ground terminal and the other end of the secondary coil of the nth transformer defines a second balanced terminal, ends of the secondary coils of the first transformer to (n−1)th transformer are connected to the one end of the secondary coil of the nth transformer, ends of the primary coil of the second transformer to nth transformer are connected to the one end of the primary coil of the first transformer and the other ends of the primary coils of the second transformer to nth transformer are respectively connected to the other ends of the secondary coils of the preceding transformers; and
  a shape of the primary coil of the first transformer is set such that a line width of the primary coil of the first transformer increases or decreases from the one end towards the other end, and a shape of the secondary coil of the nth transformer is set such that a line width of the secondary coil of the nth transformer increases or decreases from the one end towards the other end.

* * * * *